United States Patent [19]
Ito et al.

[11] Patent Number: 5,111,573
[45] Date of Patent: May 12, 1992

[54] DEVICE AND METHOD OF EXCHANGING TOOLS

[75] Inventors: Yasushi Ito; Tamio Otani, both of Hadano; Tadanori Dobashi, Kawasaki; Akira Irie, Kanagawa; Akihiro Matsuya, Ebina, all of Japan

[73] Assignee: Hitachi Seiko Ltd., Ebina, Japan

[21] Appl. No.: 687,064

[22] Filed: Apr. 18, 1991

[30] Foreign Application Priority Data

Apr. 20, 1990 [JP] Japan .................................. 2-102979
Jun. 2, 1990 [JP] Japan .................................. 2-144667

[51] Int. Cl.⁵ .......................................... B23Q 3/157
[52] U.S. Cl. ..................................... 483/1; 211/1.57; 483/56; 483/57; 483/61
[58] Field of Search ......................................... 29/568

[56] References Cited

U.S. PATENT DOCUMENTS

| | | | |
|---|---|---|---|
| 3,973,863 | 8/1976 | Smith | 29/568 X |
| 4,419,807 | 12/1983 | Moulin | 29/568 |
| 4,520,551 | 6/1985 | Imhof | 29/568 |
| 4,658,494 | 4/1987 | Ohtani et al. | 29/568 |
| 4,819,320 | 4/1989 | Cairns et al. | 29/568 |
| 4,873,756 | 10/1989 | Yamane et al. | 29/568 |

*Primary Examiner*—William Briggs
*Attorney, Agent, or Firm*—Antonelli, Terry, Stout & Kraus

[57] ABSTRACT

A device for exchanging tools for use with a spindle has a tool holding device having a plurality of tool holding members disposed at predetermined intervals. Each tool holding member is supported for movement in its axial direction and is axially driven by a drive device so that a tool is transferred between the tool holding member and the spindle. The invention is also concerned with a tool exchanging method.

7 Claims, 7 Drawing Sheets

DEVICE AND METHOD OF EXCHANGING TOOLS

BACKGROUND OF THE INVENTION

1. Field of the Invention

The present invention relates to a device and a method of exchanging a tool between a tool holding device and a spindle which is capable of approaching and moving away from the tool holding device, the tool holding device having a plurality of tool holding members disposed at predetermined intervals. More particularly, the present invention relates to the device and method of exchanging a tool for use in a drilling machine for drilling a hole in a printed circuit board.

2. Description of the Prior Art

Hitherto, a conventional drilling machine for drilling a hole in a printed circuit board has been disclosed in Japanese Patent Unexamined Publication No. 62-94210. According to this disclosure, the conventional drilling machine has been arranged in such a manner that a tool holding device of a type disclosed in Japanese Utility Model Unexamined Publication No. 62-201638 and holding a plurality of drills is secured to a table of the drilling machine on which a printed circuit board is placed so that desired holes are drilled while exchanging the tool.

The conventional tool holding device of the type described above has an advantage that a multiplicity of tools can be held. However, the tool cannot directly be exchanged between the tool holding device and the spindle since the interval of the held tools is excessively reduced.

Therefore, the structure has been arranged in such a manner that a transfer station for transferring tools is provided for the tool holding device so that a tool held by the tool holding device is temporarily held by the transfer station and the tool is subsequently transfers from the transfer station to the spindle. Furthermore, the drill held by the spindle is temporarily returned to the transfer station before it is moved from the transfer station to the tool holding device.

However, the conventional tool holding device thus arranged has encountered a problem in that a long period of time is required to exchange the tools, lowering the working efficiency because the conventional tool holding device is arranged to send/receive tools via the transfer station.

SUMMARY OF THE INVENTION

Accordingly, an object of the present invention is to provide a device and method for directly exchanging tools between a tool holding device and a spindle.

According to one feature of the present invention, there is provided a tool exchanging device for exchanging tools between a tool holding device having a plurality of tool holding members disposed at predetermined intervals and a spindle movable toward and away from said tool holding device. Each of the tool holding members is supported for movement in its axial direction. The driving device is provided for moving each of the tool holding members in its axial direction.

According to another feature of the present invention, there is provided a method of exchanging tools between a tool holding device having a plurality of tool holding members disposed at predetermined intervals and a spindle movable toward and away from the tool holding device. The method comprises the steps of:

supporting each of the tool holding members for movement in their axial directions;

positioning the spindle above a desired tool holding member;

applying an upward force to all of the tool holding members to move them upwardly; and moving downwardly the spindle to move the desired tool holding member downwardly against the upward force acting thereon while a tool is transferred from one of the spindle and the desired tool holding member to another.

According to the present invention, tools disposed in the tool holding device at short intervals can directly be transferred from the tool holding device to the spindle. Therefore, the tool relaying operation at a tool transfer station can be eliminated to remarkably shorten the time required to exchange tools, whereby the working efficiency to be improved.

The above and other objects, features and advantages of the invention will become more apparent from the following description.

DESCRIPTION OF PREFERRED EMBODIMENTS

A preferred embodiment of the present invention will now be described with reference to FIGS. 1 to 6.

Figure 1:
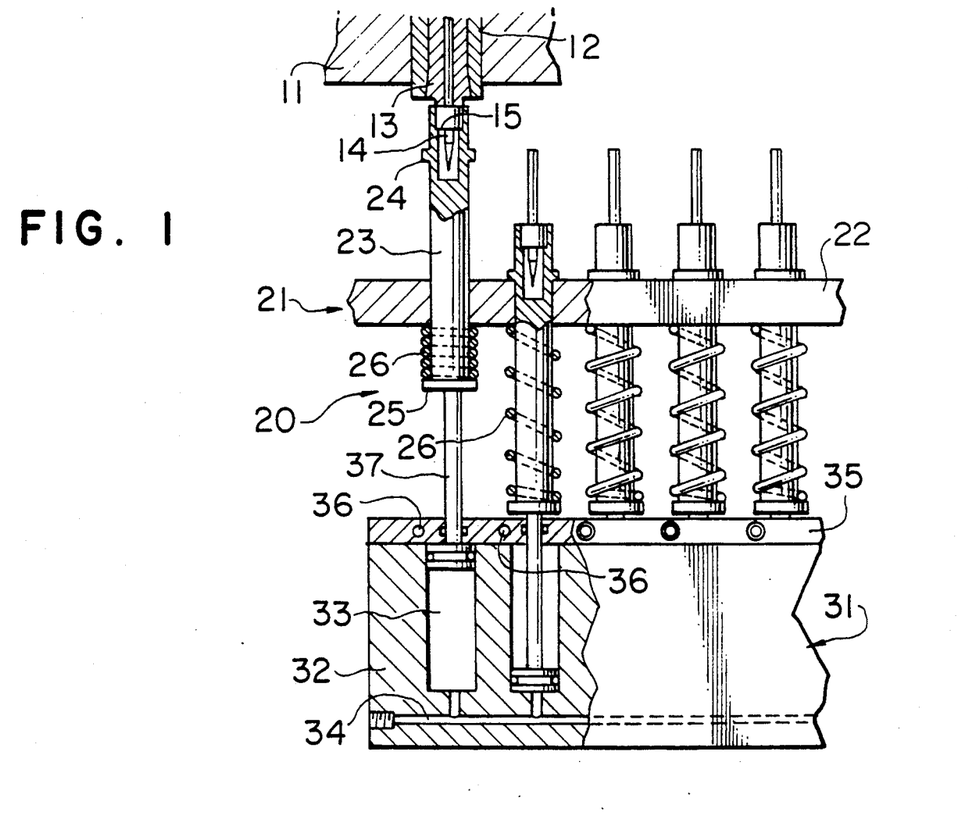
FIG. 1 is a partially cross-sectional front elevation of an embodiment of a tool exchanging device according to the present invention.
Figure 2:
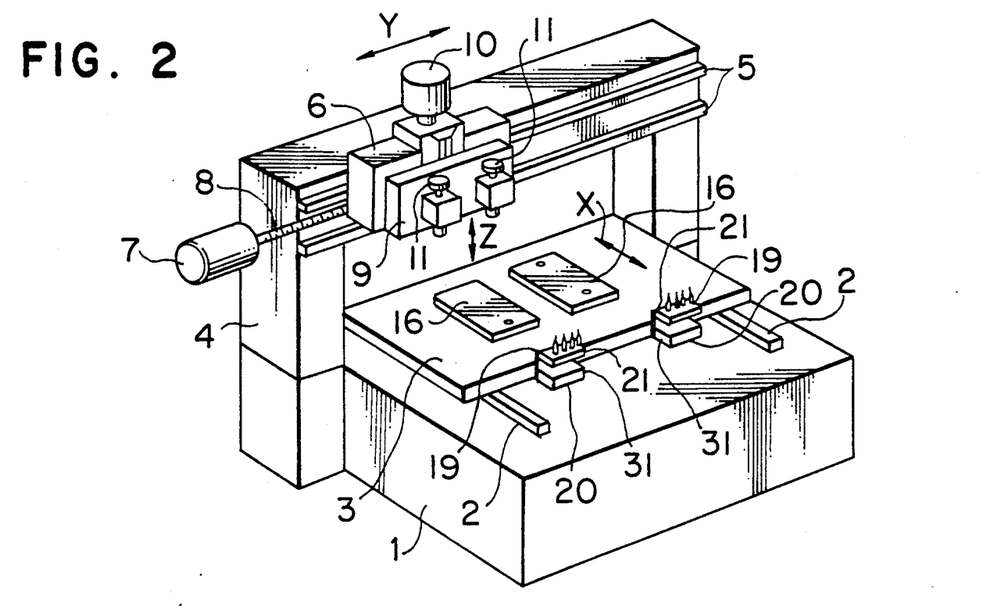
FIG. 2 is a perspective view of an example of a machine equipped with the tool exchanging device according to the present invention.
Figure 3:
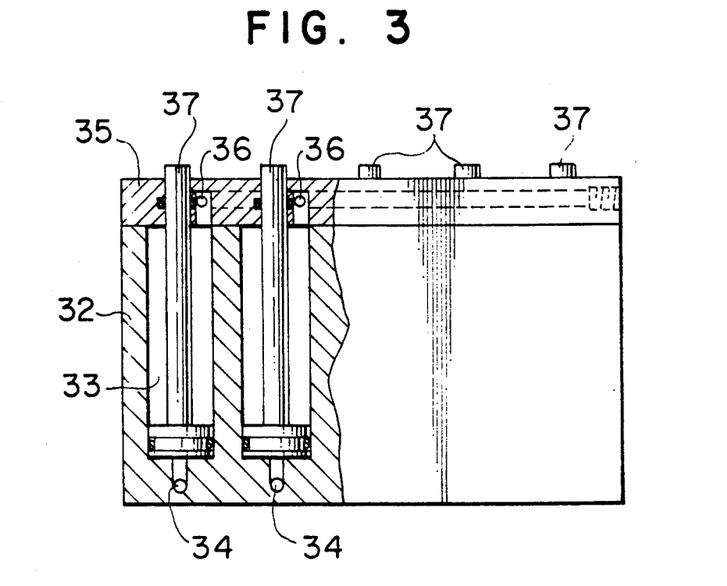
FIGS. 3 and 4 are enlarged partially cross-sectional side elevation and partially cross-sectional front elevation of a driving means shown in FIG. 1.
Figure 4:
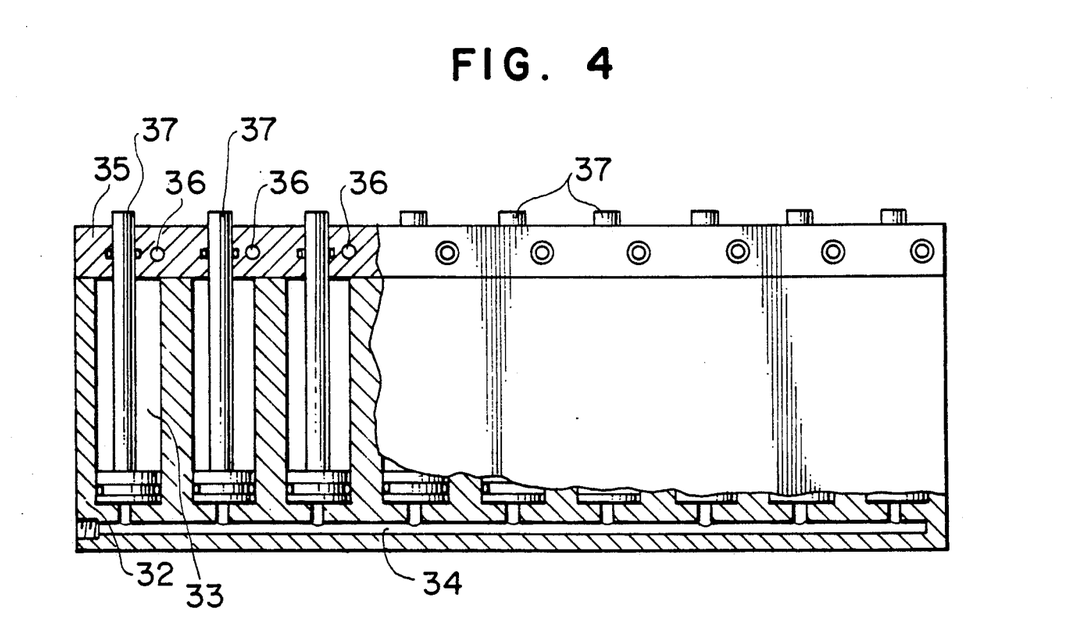

Referring to FIG. 2, reference numeral 1 represents a bed of a drilling machine capable of drilling a hole in each of printed circuit boards. Reference numeral 2 represents guides secured to the bed 1. Reference numeral 3 represents a table which is movably supported by the guides 2 in such a manner that the table 3 can be moved in directions indicated by an arrow X by a screw type feeding mechanism (omitted from illustration). Reference numeral 4 represents a column which is secured to the bed 1 in such a manner that the column 4 bridges the table 3. Reference numeral 5 represents guides secured to the front surface of the column 4. Reference numeral 6 represents a slider movably supported by the guides 5. Reference numeral 7 represents a motor supported by the column 4. Reference numeral 8 represents a feeding screw which is connected to the motor 7, rotatably supported by the column 4 and threadably engaged with a nut portion (omitted from illustration) formed in the slider 6. As a result, when the motor 7 is rotated, the slider 6 can be moved in directions indicated by an arrow Y. Reference numeral 9 represents a saddle movably supported by the slider 6 so as to be moved in directions indicated by an arrow Z by a screw feeding mechanism which is operated by a motor 10. Reference numeral 11 represents spindles supported by the saddle 9, each of the spindles 11 having a rotor 12 and a chuck 13 as shown in FIG. 1 so that each of tools 14 having a positioning ring 15 thereon is held by the chuck 13.

Reference numeral 16 represents a plurality of printed circuit boards fixed to the table 3 at predetermined positions.

Reference numeral 20 represents a plurality of tool exchanging devices which are secured to the table 3 via brackets 19. As shown in FIG. 1, each of the tool exchanging devices 20 comprises a tool holding device 21 and a drive device 31, the tool exchanging devices 20 being disposed at predetermined intervals in such a manner that they confront each other.

Reference numeral 22 represents a cassette having a plurality of holes formed therein at predetermined intervals to form a matrix. Reference numeral 23 represents a plurality of tool posts which constitute tool holding members, the tool posts 23 being axially movably supported by the cassette 22. Each of the tool posts 23 has, in the upper portion thereof, a hole for holding a ring 15 of a tool 14 and receiving an end portion of the tool 24, the tool post 23 further having a stop 24 formed on the outer surface thereof. Reference numeral 25 represents a ring secured to the lower end portion of the tool post 23. Reference numeral 26 represents a coil spring provided around the tool post 23 and extending between the cassette 22 and the ring 25.

Reference numeral 32 represents a cylinder body which has formed therein a plurality of cylinders 33 arranged at the same intervals as the intervals of the above-mentioned holes formed in the cassette 22. The cylinder body 32 has a plurality of fluid passages 34 which are connected to the bottoms of the cylinders disposed in the respective columns of the above-described matrix. Reference numeral 35 represents a cap which has holes connected to the cylinders 33, the cap 35 being secured to the cylinder body 32. The cap 35 has a plurality of fluid passages 36 which are connected to the top end portions of respective cylinders 33 disposed in rows of the above-described matrix. Reference numeral 37 represents a piston movably fitted in each cylinder 33.

Figure 5:
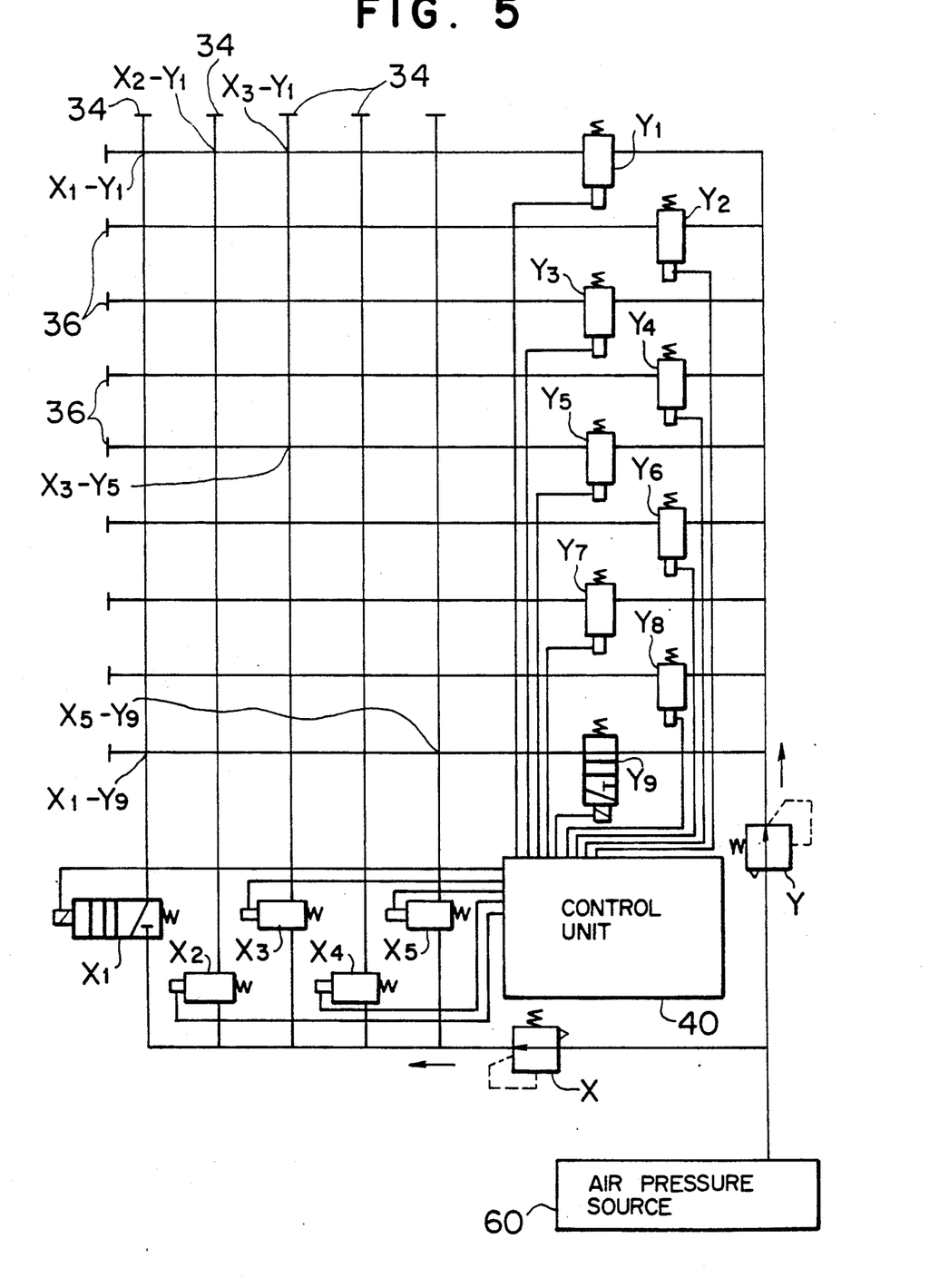
FIG. 5 illustrates an example of a fluid pressure circuit for use in a fluid supplying device.

The above-described fluid passages 34 and 36 are, as shown FIG. 5, connected to a compressed air supply source 60 via pressure regulators X and Y and solenoid valves X1 to X5 and Y1 to Y9. Reference numeral 40 represents a control unit for switching over the fluid passages by the solenoid valves X1 to X5 and Y1 to Y9.

Then, the operation of the tool exchanging device thus described will now be described.

When the solenoid valves X1 to X5 are operated, the fluid passage 34 communicate with the atmosphere. Furthermore, when the solenoid valves Y1 to Y9 are operated, the compressed air is supplied to the fluid passages 36. In consequence, the pistons 37 are respectively depressed, so that each of the tool posts 23 is depressed by the action of the spring 26 to a waiting position at which the stop 24 is in contact with the cassette 22.

Figure 6A:
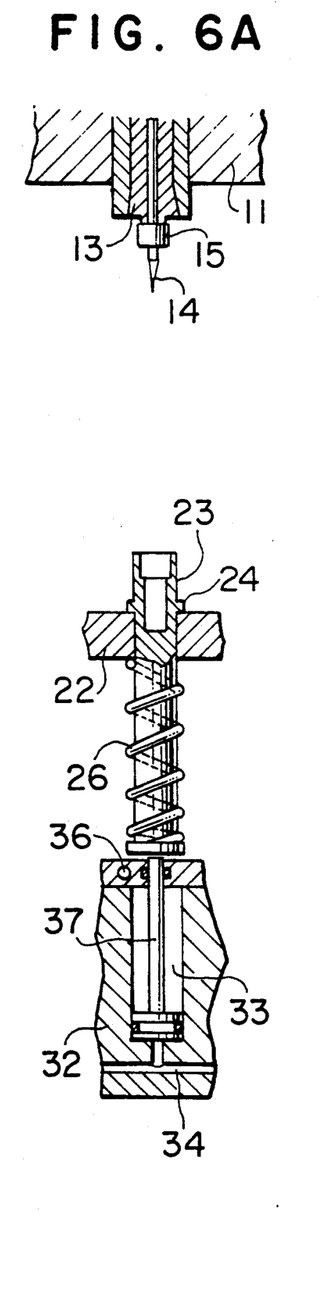
FIGS. 6A to 6E illustrate the sequential steps of exchanging tools.
Figure 6B:
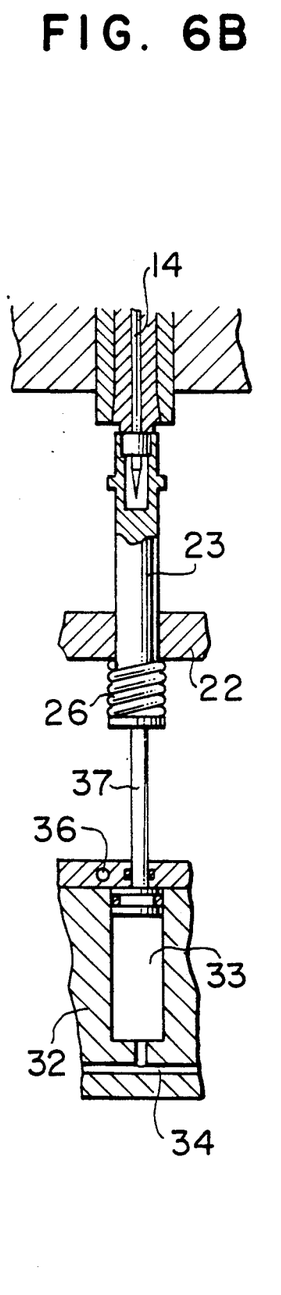

In this state, the spindle 11 which is holding a tool 14 which has completed the desired work is moved to a position at which the spindle is axially aligned with a corresponding tool post 23, as shown in FIG. 6A, due to a relative movement between the table 3 and the slider 6. Thus, the spindle 11 is brought to a tool exchanging position as shown in FIG. 6B.

Assuming that the tool post 23 in question is positioned at a position X1-Y9 shown in FIG. 5, the solenoid valve Y9 is operated in response to a command issued from the control unit 40 so that the fluid passage 36 connected to the solenoid valve Y9 is connected to the atmosphere. Simultaneously, the solenoid valve X1 is operated so that the compressed air is supplied to the fluid passage 34 connected to the valve X1.

Consequently, the plurality of cylinders 33 connected to the fluid passage 34 to which the compressed air is now supplied are supplied with the compressed air. However, since the cylinders 33 connected to the solenoid valves Y1 to Y8 are supplied with the compressed air from the fluid passages 36, the pistons 37 are not moved. On the other hand, since the fluid passage 36 connected to the solenoid valve Y9 is communicated with the atmosphere, the piston 37 in the cylinder 33 connected to the solenoid valve Y9 is moved upwards by the compressed air supplied from the fluid passage 34. As a result, the tool post 23 is pushed upwards to a position shown in FIG. 6B. Thus, the tool post 23 holds the ring 15 of the tool 14 held by the spindle 11 which waiting at the tool exchanging position. As a result, the spindle 11 opens its chuck 13 so that the tool 14 is released and is transferred to the tool post 23.

Figure 6C:
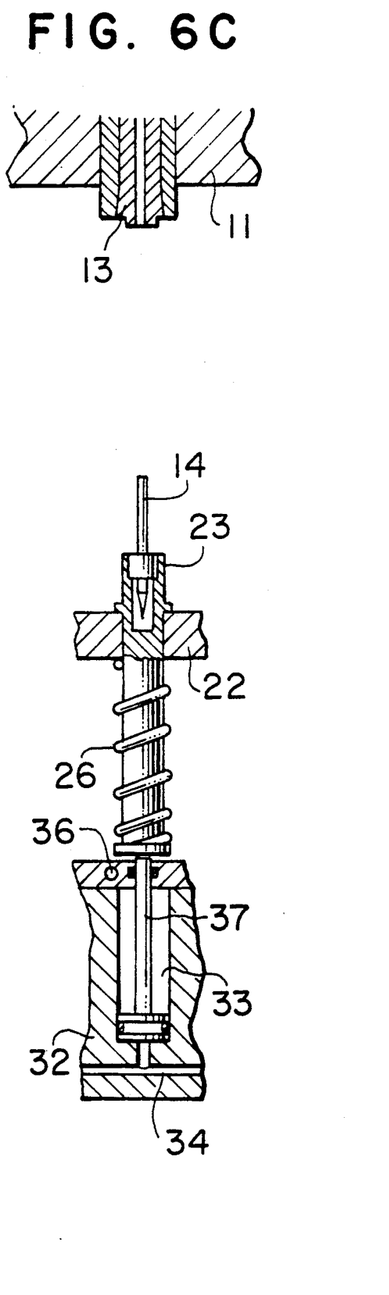

When the tool 14 has been transferred from the spindle 11 to the tool post 23 as described above, the spindle 11 is moved upwards as shown in FIG. 6C. Simultaneously, the solenoid valves X1 and Y9 are operated so that the fluid passage 34 is connected to the atmosphere and the compressed air is supplied to the fluid passage 36. As a result, the piston 37 is depressed by the compressed air to a waiting position. In consequence, the tool post 23 which holds the tool 14 is depressed to the waiting position by the urging force of the spring 26, as shown in FIG. 6C.

Figure 6D:
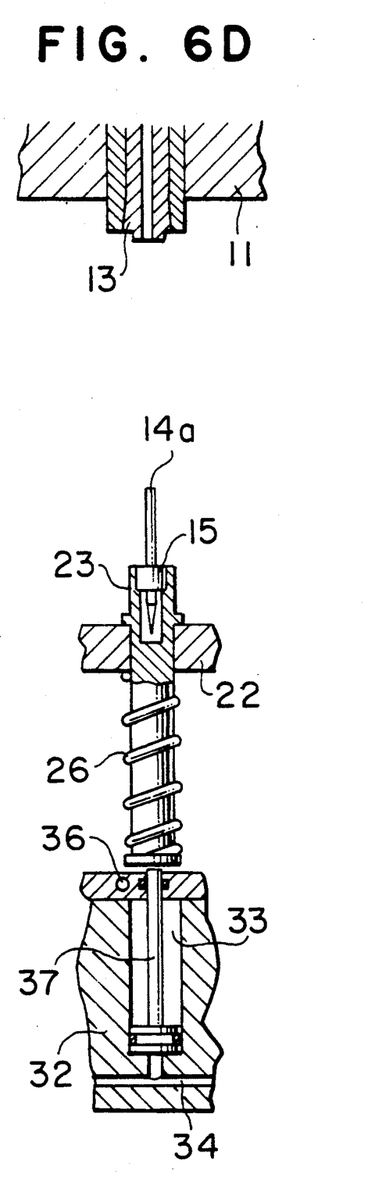

In this state, the table 3 and the slider 6 are moved so that the spindle 11 is moved to a position above a tool 14a to be used subsequently, as shown in FIG. 6D. Thus, the spindle 11 is moved to a tool exchanging position as shown in FIG. 6E.

Figure 6E:
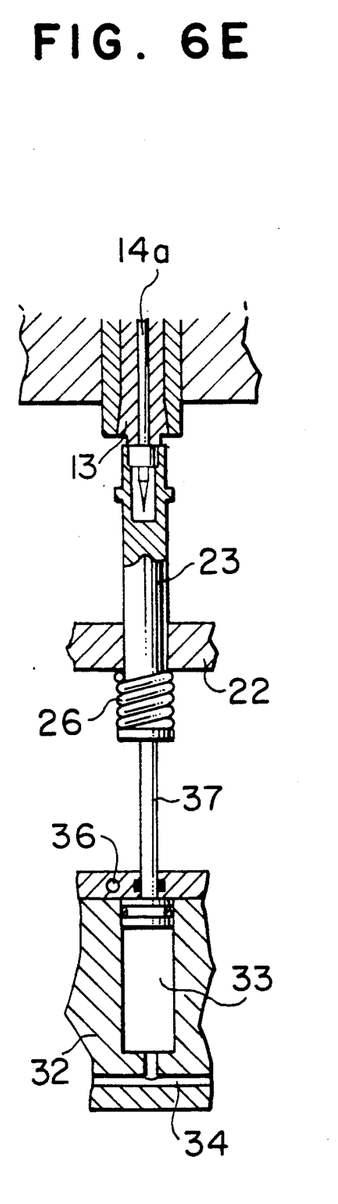

If the tool post 23 shown in FIGS. 6D and 6E is positioned at a position X3-Y5 shown in FIG. 5, the solenoid valve Y5 is operated so that the fluid passage 36 connected to the solenoid valve Y5 is connected to the atmosphere. Simultaneously, the solenoid valve X3 is operated so that the compressed air is supplied to the fluid passage 34 connected to the valve X3.

As a result, the compressed air is supplied to the plurality of cylinders 33 connected to the fluid passage 34 to which the compressed air is now supplied. However, since the cylinders 33 connected to the solenoid valves Y1 to Y4 and Y6 to Y9 are also supplied with the compressed air, the pistons 37 connected to these valves are not moved. On the other hand, the piston 37 of the cylinder 33 connected to the valve Y5 is moved upwards by the compressed air supplied from the fluid passage 34 since the fluid passage 36 connected to the valve Y5 is connected to the atmosphere. As a result, the tool post 23 is moved upwards, as shown in FIG. 6E, so as to cause the shank portion of the tool 14a to be inserted into the chuck 13 of the spindle 11 which is waiting at the tool exchanging position. Then, the spindle 11 closes its chuck 13 so as to grip and receive the tool 14a from the tool post 23.

After the tool 14 has been transferred from the tool post 23 to the spindle 11, the spindle 11 is moved upwards to the same level as that shown in FIG. 6A. Simultaneously, the solenoid valves X3 and Y5 are operated so that the fluid passage 34 is connected to the atmosphere and the compressed air is supplied to the fluid passage 36. In consequence, the piston 37 is depressed to the waiting position by the compressed air. Thus, all the tool posts 23 are depressed to their waiting positions by the urging forces of the springs 26.

In this state, the table 3 and the slider 6 are moved so as to bring the tool 14a to a machining position so that machining is started.

As described above, according to this embodiment, the necessity for transferring a tool to a transfer station at the time of exchanging the tool can be eliminated, and the tool can be directly returned to a tool post and another tool can be directly supplied from another tool post. Consequently, the time required to exchange tools can significantly be shortened.

In the above-described embodiment, the pressure of the compressed air to be supplied to the cylinders 33 to move the pistons 37 upwards may be of the same pressure level as the pressure for driving the piston 37s downwards.

Furthermore, the cylinders 33 may be arranged independently and may also be operated individually.

Another embodiment of the present invention will now be described.

According to this embodiment, the pressure regulators X and Y included in the fluid pressure circuit shown in FIG. 5 are adjusted such that the pressure level at the outlet of the regulator Y is higher than that of the governor X.

When the solenoid valves X1 to X5 and Y1 to Y9 are operated, the fluid passages 34 and 36 are supplied with compressed air. By virtue of the pressure difference in the supplied compressed air, each of the pistons 37 is depressed, and each of the tool posts 23 is also depressed by the action of the spring 26 to a waiting position at which the stop 24 is positioned adjacent to the cassette 22.

In this state, the spindle 11 which is holding the tool 14 which has completed a desired work is moved to a position in which the spindle 11 is axially aligned with the a corresponding tool post 23, as shown in FIG. 6A, due to a relative movement between the table 3 and the slider 6. Thus, the spindle 11 is placed at the tool exchanging position, as shown in FIG. 6B.

Assuming that the tool post 23 shown in FIG. 6A is positioned at a position X1-Y9 shown in FIG. 5, the solenoid valves X2 to X5 and Y9 are operated in response to commands issued from the control unit 40 so that the fluid passages 34 connected to the solenoid valves X2 to X5 and the fluid passage 36 connected to the valve Y9 are connected to the atmosphere.

Consequently, the depressing force applied to the cylinder 33 connected to the solenoid valve Y9 is removed. However, the forces for raising the pistons in cylinders connected to the solenoid valves X2 to X5 are also removed, the pistons of the cylinders at positions X2-Y9, X3-Y9, X4-Y9 and X5-Y9 are not moved.

On the other hand, since the compressed air is supplied from the fluid passage 34 to the cylinder 33 connected to the solenoid valves X1 and Y9 and placed at position X1-Y9 while the fluid passage 36 connected to this cylinder 33 is connected to the atmosphere, the piston 37 in this cylinder is moved upwards to the position shown in FIG. 6B, causing the tool post to be moved upwards. The tool post 23 then supports the ring 15 of the tool 14 held by the spindle 11 which is waiting at the tool exchanging position shown in FIG. 6B. As a result, the spindle 11 opens its chuck 13 so as to release the tool 14, so that the tool 14 is transferred to the tool post 23.

After the tool 14 has been transferred from the spindle 11 to the spindle 23 as described above, the spindle 11 is moved upwards as shown in FIG. 6C. Simultaneously, the solenoid valves X2 to X5 and Y9 are operated so that the compressed air is supplied to the fluid passages 34 and 36 connected to these valves. In consequence, the piston 37 of the cylinder 33 at the position X1-Y9 is depressed to the waiting position due to the pressure difference in the compressed air. At this time, solenoid valve X1 is temporarily operated so that the fluid passage 34 is connected to the atmosphere, the speed at which the piston 37 is moved downwards can be moved upwards. As a result of this, the tool post 23 which is holding the tool 14 is depressed to the waiting position shown in FIG. 6C by the urging force of the spring 26.

In this state, the table 3 and the slider 6 are moved so as to move, as shown in FIG. 6D, the spindle 11 to a position above the tool 14a to be subsequently used. Thus, the spindle 11 is placed at the tool exchanging position as shown in FIG. 6E.

If the tool post 23 shown in FIGS. 6D and 6E is positioned at a position X3-Y5 shown in FIG. 5, the solenoid valves X1, X2, X4, X5 and Y5 are operated in response to commands issued from the control unit 40. As a result, the fluid passages connected to the solenoid valves X1, X2, X4 and X5 and the fluid passage 36 connected to the solenoid valve Y5 are connected to the atmosphere.

As a result, the depressing force acting on the cylinder 33 connected to the solenoid valve Y5 is removed. However, because the raising forces acting in the cylinder 33 connected to the electromagnetic valves X1, X2, X4 and X5 are also removed, the piston 37 of each of the cylinders 33 respectively positioned at positions X3-Y1, X3-Y2, X3-Y4 and X3-Y5 is not moved. On the other hand, the piston 37 of the cylinder 33 located at the position X3-Y5 and connected to the solenoid valves X3 and Y5 is moved upwards since the fluid passage 36 is connected to the atmosphere and the compressed air is supplied from the fluid passage 34 to the cylinder 33. As a result, the tool post 23 is moved upwards. Then, the tool post 23 causes the shank portion of the tool 14a to be inserted into the chuck 13 of the spindle 11 which is waiting at the tool exchanging position. The spindle 11 then closes its chuck 13 so as to grip and receive the tool 14a from the tool post 23.

After the tool 14a has been transferred from the tool post 23 from the spindle 11 as described above, the spindle 11 is moved upwards to the same level as that shown in FIG. 6A. Simultaneously, the solenoid valves X1, X2, X4, X5 and Y5 are operated so that the compressed air is supplied to the fluid passages 34 and 36 connected to these valves. As a result, the piston 37 is depressed due to the pressure difference in the compressed air. Therefore, all the tool posts 23 are depressed to their waiting positions by the urging forces of the springs 26.

In this state, the table 3 and the slider 6 are moved so that the tool 14a is moved to the working position so that a machining is started.

As described above, according to this embodiment, the necessity for transferring a tool to a transfer station at the time of exchanging the tool can be eliminated, and the tool can be directly returned to the tool post and a new tool can be directly supplied from another tool post. Consequently, the time required to exchange tools can significantly be shortened. Furthermore, compressed air is always supplied to each of the cylinders 33 so that the raising force acting on the lines except for the subject line (any of columns X1 to X5) including the cylinder 33 to be operated can be removed and that the depressing force acting on the line (any of lines Y1 to Y9) including the cylinder 33 to be operated can be removed. As a result, the time required to operate the cylinder 33 to be operated can be shortened even if each of the fluid passages 34 and 36 has a considerably long length.

According to the above-described embodiments, the structure is arranged such that a tool is returned from the spindle to a tool post. Therefore, two times of the upward and downward movements of the tool posts are necessary such that a tool post is first moved upwards so as to receive a tool to be returned from the spindle, the tool post is then moved downwards and then another tool post holding a another tool is moved upwards to as to transfer it to the spindle and then the other tool post is moved downwards.

Therefore, there is room for further shortening the tool exchanging time.

Furthermore, since the structure is arranged such that cylinders are provided for respective tool posts and the cylinders thus provided are individually operated, the structure of the cylinder driving device is complicated, with a resultant increase in the size and the cost of manufacture.

Accordingly, a further embodiment which will be described below is designed to further shorten the tool exchanging time, simplify the structure and reduce the cost.

Figure 7:
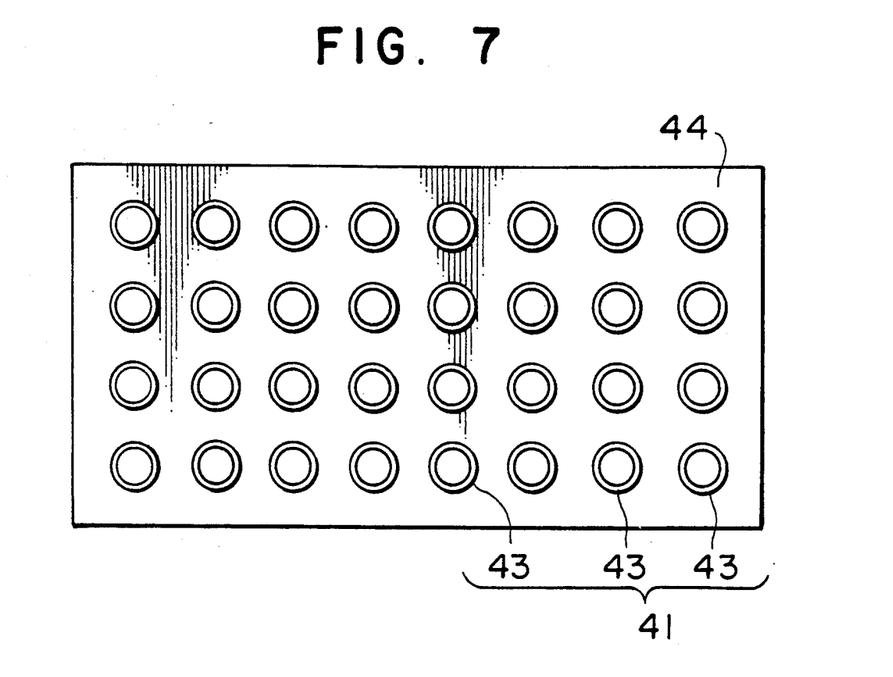
FIG. 7 is a plan view of another embodiment of the tool exchanging device according to the present invention.
Figure 8:
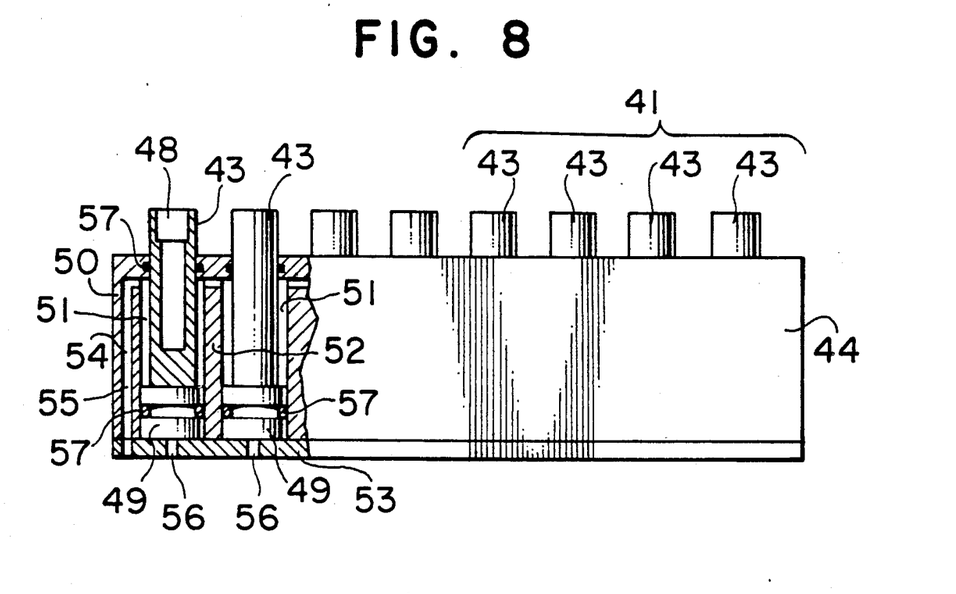
FIG. 8 is a partially sectional side elevation of the tool exchanging device shown in FIG. 7.
Figure 9:
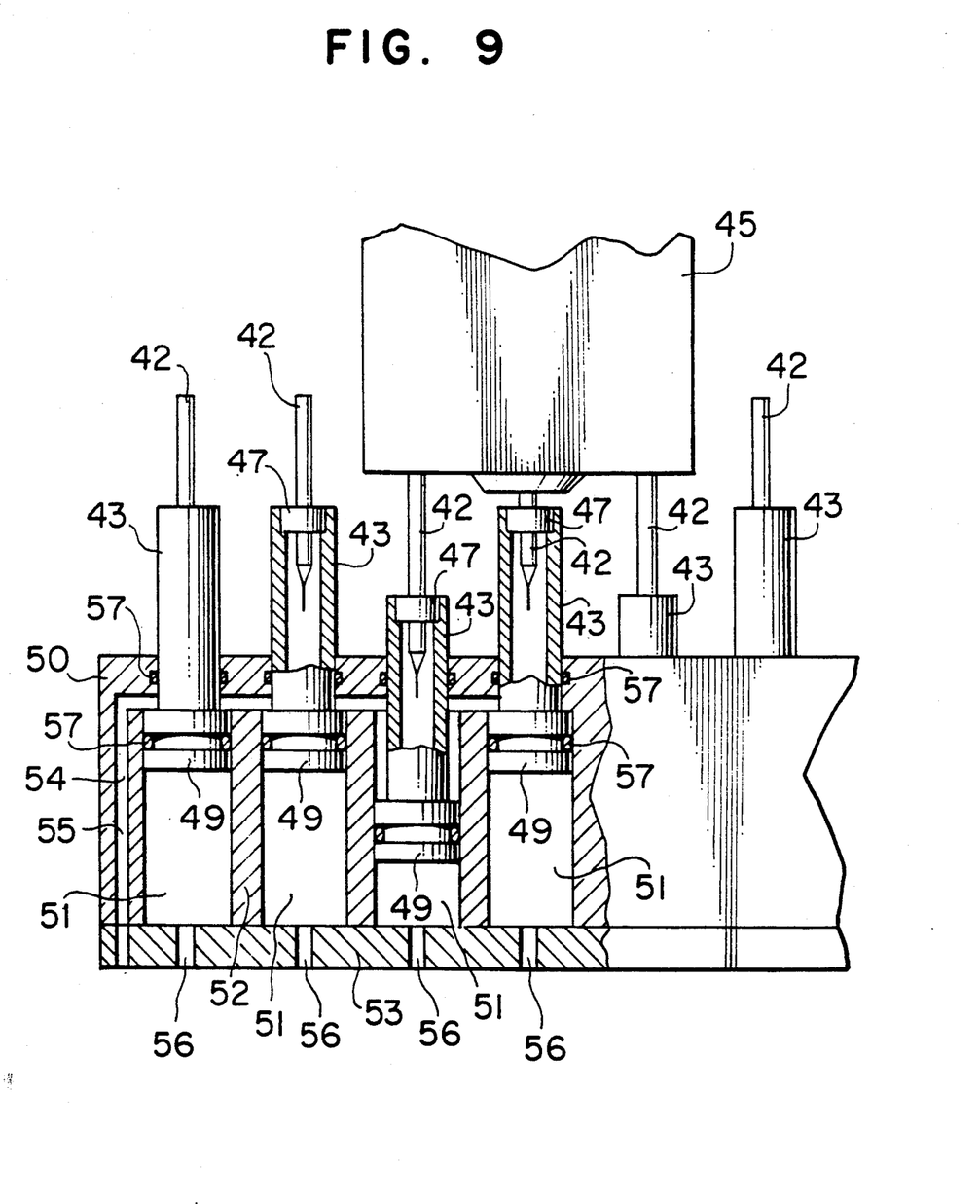
FIG. 9 illustrates the operation of sending/receiving the tool performed by the tool exchanging device shown in FIG. 8.

FIGS. 7 to 9 illustrate the further embodiment of the tool exchanging device according to the present invention. Referring to FIGS. 7 to 9, reference numeral 41 represents a tool setting post group 41 including a plurality of tool setting posts 43 disposed at predetermined intervals, the tool setting posts 43 accommodating tools 42. The tool setting post group 41 is held by a post holder 44 such that the tool setting posts 43 can be moved vertically in the axial direction of a spindle 45.

Each tool setting post 43 is in the form of a cylindrical body having a bottom. Furthermore, the tool setting post 43 is open-topped and has an annular ring receiving recess 48 in which a positioning ring 47, which is fitted around a tool 42, can be engaged. The tool setting post 43 further includes an angular flange portion 49 formed in the lower portion of the outer peripheral surface thereof so that the flange portion 49 is slidable on the inner peripheral surface of a post-receiving hole to be described later.

The post holder 44 has a post-hole member 52 which has formed therein post holes 51 which movably receive the tool setting posts 43, the number of the post holes 51 being the same as the number of the tool setting posts 43. The post holes 51 have their tops opened in a rectangular box 50 and bottoms is closed by a bottom plate 53 of the rectangular box 50.

There is a gap 54 between the rectangular box 50 and the post-hole member 52, the gap 54 constituting an air passage 55, communicated with the open tops of the post holes 51. On the other hand, the bottom plate 53 of the rectangular box 50 has air holes 56. The air passage 55 and the air duct holes 56 are connected to a source of compressed air so that air can be supplied into and discharged out of the post holes 51.

When air under pressures supplied through the air holes 56 into the post holes 51, the tool setting posts 43 are collectively pushed upwards. When air under pressure is supplied to the air passage 55, the tool setting posts 43, which have been pushed upwards, are collectively depressed.

The air pressure for upwardly moving the above-described tool setting posts 43 is so set at a relatively low level that each of the tool setting posts 43 can be retracted, that is, moved downwards when the tool setting posts 43 are depressed by the spindle 45. Reference numeral 57 represents a seal ring provided on each tool setting post 43.

Then, the operation for exchanging tools performed by the structure according to this embodiment will now be described with reference to FIG. 9.

First, the spindle 45 is moved to a position above the tool setting post 43 of the tool setting post group 41 which must receive a tool 42 from the spindle.

Subsequently, air is supplied through the air holes 56 to the post holes 51 so that all of the tool setting posts 43 are pushed upwards toward the spindle 45.

Then, the spindle 45 is moved downwards so as to return the tool 42 to the tool setting post 43 positioned under the spindle 45. At this time, the spindle 45 also downwardly urges the tools 42 held by the tool setting posts 43 adjacent to the spindle. Since the direction in which the spindle 45 presses the top end portions of the tools 42 is the same as the direction in which each of the tool setting posts 43 is retracted, that is, moved downwards against the above-described air pressure when the tool setting posts 43 are pressed by the spindle 43. Consequently, the tool 42 can significantly smoothly be returned as desired by downwardly moving the spindle 45.

After the tool 42 has been returned to the corresponding tool setting post 43 as described above, the spindle 45 is moved upwards to a position above the tool setting post 43 which accommodates a tool 42 to be fastened next. The tool setting posts 43, which have been depressed due to the downward movement of the spindle 45, are returned to the upper positions by the air pressure which is being supplied through the air holes 56 into the post holes 51.

Subsequently, the spindle 45 is again moved downwards to that it picks up the desired tool 42 from the tool setting post 43. Although the spindle depresses other tools 42 positioned adjacently to the desired tool 42 at that time, the tool setting posts 43 which accommodate the depressed tools 42 are moved downwards. Therefore, the new tool 42 can significantly smoothly be attached to the spindle 45.

The spindle 45 which now holds the new tool 42 is moved upwards and, then, moved in a predetermined direction before commencement of its downward movement. On the other hand, air supplied to the post holes 51 in the post holder 44 through the air holes 56 is removed and simultaneously air is supplied to the post holes 51 through the air passage 55. As a result, the tool setting posts 43 are collectively moved downwards. Thus, the tool exchanging operation is ended.

The above-described operation may be automatically performed by an electric control means (omitted from illustration).

As described above, according to this embodiment, since the upward and downward movements of the tool setting posts can be ended in a single action, the time required to exchange tools can further be shortened. As a result, the working efficiency can be improved. Furthermore, since the upward and downward movements of the tool setting posts are performed in such a manner that all of the tool setting posts held by the post holder are collectively moved upwards or downwards, the structure of the driving device for upwardly and downwardly moving the tool setting posts can be simplified. As a result, the overall size and the overall cost of the tool exchanging device can be significantly reduced.

What is claimed is:

1. A tool exchange device for exchanging tools between a tool holding device having a plurality of tool holding members disposed at predetermined intervals and a spindle having an axis and axially movable toward and away from said tool holding device, wherein each of said plurality of tool holding members has an axis substantially parallel to the axis of said spindle and is supported for movement in an axial direction of said each of said plurality of tool holding members, and driving means is provided for moving said each of said plurality of tool holding members in the axial direction, said plurality of tool holding members being arranged in a matrix pattern, said driving means including a plurality of fluid-operated cylinders having axes and disposed in a matrix pattern in an axially aligned relationship with said plurality of tool holding members, respectively, wherein said driving means further include:

fluid supplying means including a first group of a plurality of fluid passages for supplying a fluid pressure to respective rows of a first group of rows of cylinders, a second group of a plurality of fluid passages for supplying a fluid pressure to respective rows of a second group of rows of cylinders, a first group of a plurality of valves for respectively supplying fluid to the plurality of fluid passages of said first group so as to respectively provide the cylinders in the rows of said first group with downward forces, a second group of a plurality of valves for respectively supplying fluid to the plurality of fluid passages of said second group so as to respectively provide the cylinders in the rows of said second group with upward forces, and controlling means for operating said first and second groups of valves; and means for urging a tool holding member of said plurality of tool holding members aligned with one cylinder of said plurality of fluid-operated cylinders when said one cylinder is simultaneously provided with the downward and upward forces, to thereby keep said one cylinder at a lowered position.

2. A tool exchanging device according to claim 1, wherein said controlling means control the valves of said first and second groups such that, so as to keep all tool holding members at their lowered waiting positions, fluid pressure is supplied to all of the fluid passages of said first group while all of the fluid passages of said second group communicate with the atmosphere and such that, so as to raise one tool holding member disposed in a desired row, the corresponding passage of said first group communicates with the atmosphere while fluid pressure is supplied to the corresponding passage of said second group.

3. A tool exchanging device according to claim 1, wherein said driving means is operative to apply upward forces to all of said tool holding members, said upward forces being of such a magnitude that, when said spindle is downwardly moved into engagement with some of the tool holding members, said some tool holding members are lowered by the downward urging force of said spindle.

4. A tool exchanging device according to claim 1, wherein the tool exchanging device is used with a drilling machine for drilling holes in printed circuit boards.

5. A tool exchange device for exchanging tools between a tool holding device having a plurality of tool holding members disposed at predetermined intervals and a spindle having an axis and axially movable toward and away from said tool holding device, wherein each of said plurality of tool holding members has an axis substantially parallel to the axis of said spindle and is supported for movement in an axial direction of said each of said plurality of tool holding members, and driving means is provided for moving said each of said plurality of tool holding members in the axial direction, said plurality of tool holding members being arranged in a matrix pattern, said driving means including a plurality of fluid-operated cylinders having axes and disposed in a matrix pattern in an axially aligned relationship with said tool holding members, respectively, wherein said driving means further include:

fluid supplying means including a first group of a plurality of fluid passages for supplying a fluid pressure to respective rows of a first group of rows of cylinders, a second group of a plurality of fluid passages for supplying a fluid pressure to respective rows of a second group of rows of cylinders, a first group of a plurality of valves for respectively supplying fluid to the plurality of fluid passages of said first group so as to respectively provide the cylinders in the rows of said first group with downward forces, a second group of a plurality of valves for respectively supplying fluid to the plurality of fluid passages of said second group so as to respectively provide the cylinders in the rows of said second group with upward forces, and controlling means for operating said first and second groups of valves; and pressure regulating means operative to control the fluid pressure such that the fluid pressure supplied to the fluid passages of said first group is higher than the fluid pressure supplied to the fluid passages of said second group whereby, when one cylinder of said plurality of fluid-operated cylinders is simultaneously provided with downward and upward forces, a tool holding member of the plurality of tool holding members associated with said one cylinder is kept at a lowered waiting position.

6. A tool exchanging device according to claim 5, wherein said controlling means control the valves of said first and second groups such that, so as to keep all tool holding members at their lowered waiting positions, fluid pressures are supplied to all of the fluid passages of said first and second groups and such that, so as to raise one tool holding member disposed in a desired row, the corresponding passage of said first group communicates with the atmosphere while the passages of said second group excepting the passage of said second group which corresponds to said one tool holding member communicates with the atmosphere.

7. A method of exchanging tools between a tool holding device having a plurality of tool holding members disposed at predetermined intervals and a spindle having an axis and axially movable toward and away from said tool holding device, each of said plurality of tool holding members having an axis substantially parallel to the axis of the spindle, said method comprising the steps of:

supporting each of said plurality of tool holding members for movement in an axial direction of said each of said plurality of tool holding members;

positioning said spindle above a desired tool holding member of said plurality of tool holding members;

applying upward forces to all of said plurality of tool holding members to move them upwardly; and downwardly moving said spindle to move said desired tool holding member downwardly against the upward force acting thereon while a tool is transferred between said spindle and said desired tool holding member wherein, when said desired tool holding member is moved downwardly by said spindle, said spindle is brought into engagement also with at least one other tool holding member of said plurality of tool holding members adjacent to said desired tool holding member, moving the at least one other tool holding member downwardly.

* * * * *